(12) United States Patent
Faber et al.

(10) Patent No.: US 12,015,398 B2
(45) Date of Patent: Jun. 18, 2024

(54) ROBUST 'HANDS ON STEERING WHEEL' CLASSIFICATION BASED ON A RELATIVE MEASUREMENT SYSTEM

(71) Applicant: IEE INTERNATIONAL ELECTRONICS & ENGINEERING S.A., Echternach (LU)

(72) Inventors: Thomas Faber, Schweich (DE); Frank Althaus, Saarbrücken (DE); Thomas Meyers, Wiersdorf (DE); Oliver Lion, Merzig (DE); Laurent Lamesch, Reichlange (LU); Michael Pütz, Trier (DE); Alan Koehler, Igel (DE)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 18/038,739

(22) PCT Filed: Nov. 24, 2021

(86) PCT No.: PCT/EP2021/082823
§ 371 (c)(1),
(2) Date: May 25, 2023

(87) PCT Pub. No.: WO2022/112330
PCT Pub. Date: Jun. 2, 2022

(65) Prior Publication Data
US 2023/0403007 A1    Dec. 14, 2023

(30) Foreign Application Priority Data

Nov. 25, 2020 (LU) .................................. LU102243
Jan. 21, 2021 (LU) .................................. LU102444

(51) Int. Cl.
*H03K 17/96* (2006.01)
*B62D 1/04* (2006.01)

(52) U.S. Cl.
CPC ........... *H03K 17/962* (2013.01); *B62D 1/046* (2013.01); *H03K 2217/96071* (2013.01);
(Continued)

(58) Field of Classification Search
CPC ...................................................... G01R 27/26
(Continued)

(56) References Cited

U.S. PATENT DOCUMENTS

2004/0119484 A1* 6/2004 Basir .................. G05G 5/28
324/680
2011/0084857 A1 4/2011 Marino et al.
(Continued)

FOREIGN PATENT DOCUMENTS

EP        1292485 B1    2/2004
WO    2012093080 A1    7/2012
(Continued)

OTHER PUBLICATIONS

J. R. Smith et al., Electric Field Sensing for Graphical Interfaces, IEEE Comput. Graph. Appl., 18(3):54-60, 1998.
(Continued)

*Primary Examiner* — Vincent Q Nguyen
(74) *Attorney, Agent, or Firm* — Reising Ethington P.C.

(57) ABSTRACT

A method of operating a capacitive sensing device that includes a capacitive sensor having at least one sense electrode, a measurement signal source for providing an alternating electric measurement signal with at least three fixed predefined signal frequencies to the at least one sense electrode, and an impedance measurement circuit for determining an unknown complex impedance of the at least one sense electrode from a response to the provided electric
(Continued)

measurement signal. The method includes, for each predefined signal frequency: determining statistical quantities and signal parameters regarding a number of determined momentary values of an unknown complex impedance; eliminating portions up to a predefined hand touch movement lower limit frequency and from a predefined high-frequency limit down to a predefined hand touch movement upper limit frequency; excluding statistical outliers from determined momentary values; and using an eliminated frequency portion for calculating a momentary reference value for the unknown complex impedance.

13 Claims, 5 Drawing Sheets

(52) U.S. Cl.
CPC ............ *H03K 2217/960735* (2013.01); *H03K 2217/96078* (2013.01)

(58) Field of Classification Search
USPC ................................ 324/663, 679, 681, 686
See application file for complete search history.

(56) References Cited

U.S. PATENT DOCUMENTS

2018/0032200 A1    2/2018  Hong et al.
2022/0376691 A1*  11/2022  Faber .................... B62D 1/046

FOREIGN PATENT DOCUMENTS

WO      2016096815 A1    6/2016
WO      2017129533 A1    8/2017

OTHER PUBLICATIONS

International Search Report for application No. PCT/EP2021/082823, dated Feb. 11, 2022, 3 pages.
Written Opinion for application No. PCT/EP2021/082823, dated Feb. 11, 2022, 6 pages.

* cited by examiner

ROBUST 'HANDS ON STEERING WHEEL' CLASSIFICATION BASED ON A RELATIVE MEASUREMENT SYSTEM

TECHNICAL FIELD

The invention relates to a method of operating a capacitive sensing device, a capacitive sensing device configured to automatically executing such method, a vehicle steering wheel comprising such capacitive sensing device, and a software module for controlling an automatic execution of such method.

BACKGROUND

In the field of automotive vehicle sensor application it is known to employ sensors for so-called Hands off Detection (HOD) systems, in which one or more sensors provide information about whether a driver has his hands on a steering wheel of a vehicle or not. This information can be provided as input to an Automatic Driver Assistance System (ADAS) such as an Adaptive Cruise Control (ACC), which, based on the provided sensor signal, can alert the driver and remind him or her to take control of the steering wheel again. In particular, such HOD systems can be used in support to fulfill a requirement of the Vienna convention that the driver must remain in control of the vehicle at all times. HOD systems may as well be employed in a parking assistance system or an ADAS that is configured for evaluating a driver activity at high speed.

It is further known to employ capacitive sensors in vehicle HOD systems. Capacitive sensors and capacitive measurement and/or detection devices employing capacitive sensors have a wide range of applications, and are among others used for the detection of the presence and/or the position of a conductive body or body portion in the vicinity of an antenna electrode.

As used herein, the term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

By way of example, WO 2016/096815 A1 proposes a planar flexible carrier for use in steering wheel heating and/or sensing of the presence of the driver's hand(s) on the steering wheel. The planar carrier, which can be employed for mounting on a rim of a steering wheel without wrinkles, comprises a portion of planar flexible foil of roughly rectangular shape having two longitudinal sides and two lateral sides. A length B of the lateral sides is 0.96 to 1.00 times the perimeter of the rim. A number of N cut-outs per unit length are provided on each of the longitudinal sides, wherein the cut-outs of one side are located in a staggered fashion relative to opposing cut-out portions on the opposite side. The determining of an optimum shape and size of the cut-outs is described. Further described is a heat carrier, a heating and/or sensing device and methods for their production.

In some (so-called "loading mode") capacitive sensors, the at least one antenna electrode serve at the same time as sensing electrode. In this case, a measurement circuit determines a current flowing into the at least one antenna electrode in response to an oscillating voltage being applied to them. The relationship of voltage to current yields the complex impedance between the at least one antenna electrode and ground potential. In an alternative version of capacitive sensors ("coupling mode" capacitive sensors), the transmitting antenna electrode(s) and the sensing electrode(s) are separate from one another. In this case, the measurement circuit determines a current or voltage that is induced in the sensing electrode when at least one transmitting antenna electrode is being operated.

Different capacitive sensing mechanisms are for instance explained in the technical paper entitled "*Electric Field Sensing for Graphical Interfaces*" by J. R. Smith et al., published in IEEE Computer Graphics and Applications, 18(3): 54-60, 1998, which shall hereby be incorporated by reference in its entirety with effect for the jurisdictions permitting incorporation by reference.

The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength may, for instance, be determined by applying an alternating voltage signal to an antenna electrode and by measuring the current flowing from that antenna electrode either towards ground (in the loading mode) or into a second antenna electrode (in the coupling mode). This current may be measured by a transimpedance amplifier, which is connected to the sensing electrode and which converts the current flowing into the sensing electrode into a voltage proportional to this current.

Some capacitive sensors are designed as sense-only capacitive sensors having a single sense electrode. Also, quite often capacitive sensors are used that comprise a sense electrode and a so-called "guard electrode" that are proximally arranged and mutually insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

It is further known to arrange such guard electrode between sense electrodes of a capacitive sensor and a vehicle seat heater member or a vehicle steering wheel heater member. As heater members, for instance heater wires, in many cases are electrically connected to vehicle ground they may have a large effect on a capacitive sensor signal to be measured. Consequently, malfunctions such as a broken heater wire (double break) or a disconnected heater member can have an impact on the measurement such that any detection and/or misclassification cannot be excluded. Use of a guard electrode as a second layer underneath the sense electrode can avoid a direct coupling between the sense electrode and a heater member and can therefore at least mitigate the heater malfunction impact on the detecting and/or classification capability of a capacitive sensor system.

Multi-zone HOD capacitive sensor systems are known in the art that comprise a plurality of distinct and independent sensing zones along the steering wheel. These HOD capacitive sensor systems are capable of distinguishing various ways of holding the vehicle steering wheel by the driver (one hand, two hands, angular position).

For instance, European patent EP 1 292 485 B1 describes a steering wheel for a vehicle, which comprises a steering ring, a hub, and at least one spoke connecting the steering ring and the hub. On the steering ring, sensors are arranged in a distributed manner along the circumference of the steering ring, extending over the entire length of the steering ring. The sensors may be configured for operating on a resistive, capacitive or inductive basis. The sensors are subdivided into a plurality of segments arranged one behind another in the longitudinal direction of the steering ring. The spacing between two segments of a sensor from one another in the longitudinal direction of the steering ring is smaller than a finger width, wherein the segments of the sensors, in the longitudinal direction of the steering ring, are shorter than a finger width. By that, the thumb and the fingers of the hand can be reliably distinguished from each other and a high spatial resolution is achieved.

Other challenges for a capacitive sensing device that is supposed to meet a specific cost requirement, especially when used in an automotive application, are an as low as possible electromagnetic interference (EMI) susceptibility and also a low susceptibility to changes of environmental conditions.

A solution with regard to EMI is proposed in WO 2017/129533 A1 in an application of a capacitive seat occupancy detection and classification system. The system includes an impedance measurement circuit and a control and evaluation unit. The impedance measurement circuit is configured for providing periodic electrical measurement signals to a capacitive sensor of N different fundamental frequencies, wherein N is a natural number of at least 3, and to determine a complex impedance from each of determined sense currents in the capacitive sensor. The control and evaluation unit is configured to determine a seat occupancy class for each one of the complex impedances determined at the at least N different fundamental frequencies, and to determine a final seat occupancy class derived by a majority decision among the determined seat occupancy classes. A high probability exists that only a fraction of the different fundamental frequencies are disturbed by resonances which might be present due to parasitic inductances and capacitances in an installed state of the capacitive seat occupancy detection and classification system.

From US 2018/0032200 A1 a capacitive switch device is known, in particular for use in vehicles, which enables combined capacitance measurement. A reference value reflects a capacitance value obtained at a sensor electrode to reflect a signal attenuation state in which a human body touch occurs so that more precise touch detection can be achieved. The capacitive switch device comprises a touch sensing unit including a sensing electrode and a transmission electrode, which are disposed on a substrate, and a touch control module disposed on a substrate and configured to confirm a manipulator's contact manipulation state based on a sensing signal from the touch sensing unit and to output a touch output signal. The transmission electrode outputs a transmission signal in response to a transmission control signal from the touch control module. The sensing electrode detects a signal in response to a sensing control signal from the touch control module for application to the touch control module. The touch control module activates the sensing electrode and the transmission electrode according to a preset mode.

A self-capacitance and a mutual-capacitance are simultaneously or selectively measured in a time division manner with respect to a single button using two electrodes. When the self-capacitance is measured, a transmission sensor is activated to extract a combined signal obtained by fusing the mutual-capacitance and the self-capacitance. A waveform change pattern is analyzed of the signal obtained through the extraction to determine whether or not the human body is touched, thereby avoiding an erroneous operation due to an external environmental impact. The capacitive switch device allows a capacitance value obtained at a sensor electrode to be set to be continuously reflected by a reference value (i.e., baseline) at a constant cycle, and recognizes and processes a constant pattern appearing consistently until the human body is contacted with and separated from the sensor, thereby minimizing the external environmental impact.

SUMMARY

It is therefore an object of the invention to provide a capacitive sensing device and a method of operating such capacitive sensing device, in particular for detecting a driver's hand status with regard to a steering wheel of a vehicle, wherein the capacitive sensing device shows improved detection reliability with a reduced number of false classification events and enhanced robustness against environmental condition changes, and preferably an as low as possible EMI susceptibility.

The object is achieved by a method of operating a capacitive sensing device and a capacitive sensing device according to the claims.

In one aspect of the present invention, the object is achieved by a method of operating a capacitive sensing device. The capacitive sensing device includes at least one capacitive sensor having at least one sense electrode, a measurement signal source that is configured for providing an alternating electric measurement signal comprising at least three fixed predefined signal frequencies at least to the at least one sense electrode, and an impedance measurement circuit that is configured for determining an unknown complex impedance of the at least one sense electrode with regard to a reference potential from a response to the provided electric measurement signal.

The proposed method comprises at least the following steps that are to be executed for each predefined signal frequency:

determining a predefined number of momentary values of the unknown complex impedance, determining statistical quantities and signal parameters regarding the determined momentary values, eliminating from the determined momentary values a frequency portion up to a predefined hand touch movement lower limit frequency, eliminating from the determined momentary values a frequency portion from a predefined high-frequency limit down to a predefined hand touch movement upper limit frequency for obtaining remaining determined momentary values, excluding the respective determined momentary values if at least one determined statistical quantity exceeds a predefined critical threshold value, and using the eliminated frequency portion up to the lower limit frequency of the determined momentary values for calculating a momentary reference value for the unknown complex impedance.

The method further comprises the steps of:

using the remaining determined momentary values for determining a signal classification by checking a fulfillment of at least one predefined condition that includes the momentary reference value for the unknown complex impedance, and generating an output signal that is representative of the result of the step of checking the fulfillment of the at least one predefined condition.

The phrases "configured to" and "configured for", as used in this application, shall in particular be understood as being specifically programmed, laid out, furnished or arranged.

The determined momentary values of the unknown complex impedance may be in response of an object moving relative to the at least one sense electrode, for instance a driver's hand moving along a vehicle steering wheel. These momentary values may be influenced by the presence of electromagnetic interference during the measurement and/or by changes of environmental conditions such as temperature and/or moisture, by which electric properties of the material in or around the capacitive sensing device may change.

It is one insight of the present invention that electromagnetic interference usually happens on a timescale that is much faster than a fastest possible movement of a human hand, and that changes of environmental conditions usually occur on a timescale that is much slower than a slowest intended movement of a human hand, and that both effects can be separated from the determined momentary values so as to obtain a clearer signal from a relative movement between an object and the at least one sense electrode.

Further, it is another insight of the present invention that eliminated portions of the determined momentary values can be used to calculate a momentary reference value that represents a virtual configuration of the at least one sense electrode being far away from possibly approaching objects, and that, moreover, this calculated momentary reference value can beneficially be employed in predefined conditions of a checking procedure for classifying the determined momentary values of the unknown complex impedance.

Thus, a method of operating a capacitive sensing device can be provided with improved detection reliability and a reduced number of false classification events. With the proposed method an enhanced robustness of the capacitive sensing device with regard to environmental condition changes and/or electromagnetic interference can be accomplished.

The proposed method can particularly be applied in an advantageous manner with capacitive sensing devices for automotive applications such as capacitive hand position detection on a vehicle steering wheel. The term "automotive", as used in this patent application, shall particularly be understood as being suitable for use in vehicles including passenger cars, trucks, semi-trailer trucks and buses.

The steps of the proposed method may be executed such that the step of determining a signal classification may be using the remaining determined momentary values obtained from all the predefined signal frequencies. However, it is also conceived within the scope of the invention that the steps of the proposed method may be executed independently for each predefined signal frequency up to and including the step of determining a signal classification for each respective predefined signal frequency. In this case, the step of generating an output signal may be based on a fulfillment of an additional predefined condition that includes the signal classifications determined for each predefined signal frequency. The additional predefined condition may comprise a majority decision among the signal classifications, similar to the method proposed in the beforementioned WO 2017/129533 A1 of determining a final seat occupancy class by conducting a majority decision among seat occupancy classes determined for each one of complex impedances determined at different fundamental frequencies.

In preferred embodiments of the method, the step of eliminating from the determined momentary values the frequency portion from a predefined high-frequency limit down to the predefined hand touch movement upper limit frequency further includes a subsequent step of averaging the magnitudes of the obtained remaining determined momentary values, by which a statistical error of measurement can be reduced.

In preferred embodiments of the method, the step of eliminating from the determined momentary values a frequency portion each include a preceding step of calculating a time derivative of magnitudes of consecutively determined momentary values of the unknown complex impedance, and wherein the steps of eliminating are based at least on using the calculated time derivative. In this way, a discontinuity in the determined momentary values of the unknown complex impedance can readily be detected, the reason for which may be for instance a wiring failure in the capacitance sensing device.

In case of a discontinuous determining of momentary values, for instance by using a sampling technique, the time derivative may be approximated by a difference quotient.

In preferred embodiments of the method, the step of checking a fulfillment of at least one predefined condition includes checking if an absolute difference between the magnitude of the remaining determined momentary values and the magnitude of the momentary reference value for the unknown complex impedance exceeds a predefined threshold value for the magnitude. In this way, the capacitive sensing device can readily and reliably verify whether an object such as a human hand is in close vicinity to the at least one sense electrode, which for instance may be installed in a vehicle steering wheel, or not.

In preferred embodiments of the method, the step of checking a fulfillment of at least one predefined condition includes checking if in a predefined period of time a sum of magnitudes of consecutively occurring signal changes of the remaining determined momentary values exceeds a predefined threshold value for the sum of magnitudes of signal changes.

The sum of magnitudes of consecutively occurring signal changes calculated for a predefined period of time can serve as an indicator for the object being in close vicinity to the at least one sensor electrode. For instance, during driving a vehicle a drivers hands are supposed to be touching or grasping the steering wheel of the vehicle, from which a predefined threshold value for the sum of magnitudes of signal changes in a predefined period of time can be derived. In this way, presence and absence, respectively, or a ratio of both, of an object in the vicinity of the capacitive sensing device can be monitored.

If, for the example of a capacitive sensing device for hand positioning detection at a vehicle steering wheel, the sum of magnitudes of consecutively occurring signal changes in the predefined period of time falls below a predefined threshold value, a failure mode exists with a high probability. Examples of such failure modes are, without being limited to: a measurement range is in saturation due to overload; an electrically conductive object such as a charging cable is placed close to the sense electrode in the steering wheel; and the driver is not driving with due attention because of being sleepy or drowsy.

Preferably, the step of determining a predefined number of momentary values of the unknown complex impedance includes sampling with a sampling period that lies between 0.1 ms and 100 ms. In this way, the capacitive sensing device is capable of detecting fast events that may be affecting a proper determining of the unknown complex impedance.

In preferred embodiments, the method further comprises a step of immediately adapting the momentary reference value upon a fulfillment of at least one condition including a time derivative of magnitudes of consecutively determined momentary values of the unknown complex impedance. In this way it is possible to account for an unintended event such as a sudden change of electrical ground connections within the capacitive sensing device, as fast changes result in large values for the time derivative of magnitudes. The adapting of the momentary reference value may be carried out by replacing the precedingly determined momentary reference value by the latest determined momentary reference value. Alternatively, the adapting of the momentary reference value may be carried out by changing the precedingly determined momentary reference value by a major portion of the difference to the latest determined momentary reference value.

In preferred embodiments of the method of operating a capacitive sensing device that is used in an automotive application, the method includes a step to be executed once in a driving cycle of a vehicle. The step comprises adapting the momentary reference value upon a fulfillment of the condition that an ambient temperature rise or an ambient humidity rise at the at least one capacitive sensor exceeds a predefined threshold for the ambient temperature rise or the ambient humidity rise, respectively, wherein the amount of adapting is determined from an a priori known temperature-dependence or humidity-dependence, respectively, of a material in the vicinity of the at least one sense electrode of the at least one capacitive sensor. The amount of adapting can, for instance, be determined by a statistical estimator.

By adapting the momentary reference value in the proposed manner, a reduced number of false classification events can be accomplished with the capacitive sensing device.

In another aspect of the invention, a capacitive sensing device is provided that includes: at least one capacitive sensor having at least one sense electrode,
  a measurement signal source that is configured for providing an alternating electric measurement signal comprising at least three fixed predefined signal frequencies at least to the at least one sense electrode,
  an impedance measurement circuit that is configured for determining an unknown complex impedance of the at least one sense electrode with regard to a reference potential from a response to the provided electric measurement signal, and
  an electronic evaluation and control unit that is configured to automatically execute steps of a possible embodiment of the method disclosed herein.

The benefits described in context with the proposed method of operating a capacitive sensing device apply as well to the capacitive sensing device to the full extent.

The proposed capacitive sensing device is particularly advantageous when used in a vehicle steering wheel for capacitive hand position detection and/or classification.

In yet another aspect of the invention, a software module for controlling an automatic execution of steps of an embodiment of the method disclosed herein is provided.

The method steps to be conducted are converted into a program code of the software module, wherein the program code is implementable in a digital data memory unit (such as a non-transitory, computer-readable medium) of the capacitive sensing device and is executable by a processor unit of the capacitive sensing device. Preferably, the digital memory unit and/or processor unit may be a digital memory unit and/or a processing unit of the electronic evaluation and control unit of the capacitive sensing device. The processor unit may, alternatively or supplementary, be another processor unit that is especially assigned to execute at least some of the method steps.

The software module can enable a robust and reliable automatic execution of the method and can allow for a fast modification of method steps.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies the invention in particular in connection with the figures.

BRIEF DESCRIPTION OF THE DRAWINGS

Further details and advantages of the present invention will be apparent from the following detailed description of not limiting embodiments with reference to the attached drawing, wherein.

In the different figures, the same parts are always provided with the same reference symbols or numerals, respectively. Thus, they are usually only described once.

DETAILED DESCRIPTION

Figure 1:
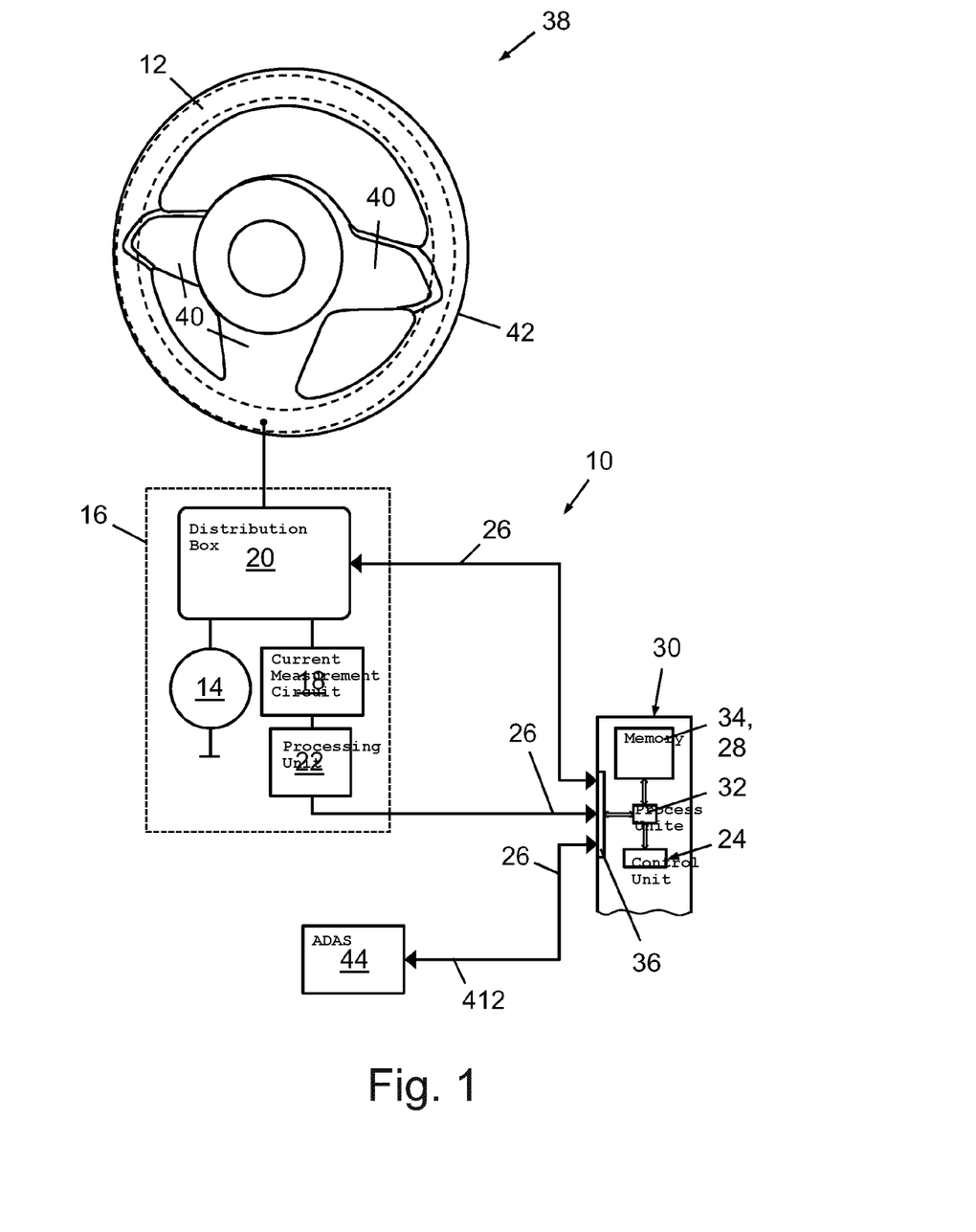
FIG. 1 schematically illustrates a vehicle steering wheel with capacitive hand position detection, comprising a capacitive sensing device in accordance with the invention.

FIG. 1 schematically illustrates a vehicle steering wheel 38 with capacitive hand position detection, particularly Hands Off Detection (HoD), comprising a capacitive sensing device 10 in accordance with the invention. The vehicle may be designed as a passenger car. The vehicle steering wheel 38 may comprise three spokes 40 connected to an outer rim 42. The capacitive sensing device 10 includes a capacitive sensor having a sense electrode 12 which is placed as a layer at the outer rim 42 of the vehicle steering wheel 38.

The sense electrode 12 may be designed as a circular ring that is circumferentially arranged at a front surface, which is facing the driver, along the outer rim 42 of the vehicle steering wheel 38, and largely runs all around the outer rim 42. The sense electrode 12 may be formed as a printed metal electrode attached on a flexible film carrier, as is known in the art.

The vehicle steering wheel 38 comprises a leather trim (not shown) that covers most part of the outer rim 42 and hides and protects the sense electrode 12 from external influences. The sense electrode 12 has a width designed to cover a major amount of an outer surface of the outer rim 42 of the vehicle steering wheel 38.

The capacitive sensing device 10 further comprises an impedance measurement circuit 16 with a measurement signal source 14. The measurement signal source 14 is configured for providing an alternating electric measurement signal comprising three fixed predefined signal frequencies to the sense electrode 12. The impedance measurement circuit 16 is configured for determining an unknown complex impedance of the sense electrode 12 with regard to a reference potential, which may be the vehicle chassis ground, from a response to the provided electric measurement signal. To this end, the impedance measurement circuit 16 also comprises a current measurement circuit 18 including current measurement means. The unknown complex impedance represents a position of an object, in this case a hand or hands of the driver, relative to the sense electrode 12.

The current measurement means may include one or more transimpedance amplifiers (TIA), whose function is to convert a complex current into an output voltage that is proportional to the determined current. The current measurement means may alternatively include analog-to-digital converters connected in parallel to an impedance of an a priori known value. In principle, any other current measurement means that appear suitable for those skilled in the art may be employed.

The electric measurement signal may be formed as a superposition of three sinusoidal electric measurement voltages having three distinct signal frequencies. The measurement signal source 14 may as well be configured to provide one of the electric measurement voltages of three distinct signal frequencies one at a time. In other possible embodiments, the measurement signal source 14 may be configured to generate an electric measurement signal of different signal shape, such as a square waveform, and with three distinct fundamental frequencies.

Furthermore, the impedance measurement circuit 16 comprises a remotely controllable electric distribution box 20 for selectively providing appropriate connections between the sense electrode 12, the measurement signal source 14 and the current measurement circuit 18.

The electric distribution box 20 may for instance include semiconductor switches such as MOSFETs (metal-oxide-semiconductor field-effect transistor). Any other switching member that appears suitable to those skilled in the art may as well be employed.

Moreover, the impedance measurement circuit 16 comprises a signal processing unit 22 that is configured for receiving output signals from the current measurement circuit 18 and for calculating complex impedances from the received output signals.

The capacitive sensing device 10 also includes an electronic evaluation and control unit 30. The electronic evaluation and control unit 30 is formed by a microcontroller that includes a digital data memory unit 34, a processor unit 32 with data access to the digital data memory unit 34, a switch remote control unit 24 for controlling the electric distribution box 20, and a control interface 36. The control interface 36 may be designed as a CAN (Controller Area Network) interface.

The electronic evaluation and control unit 30 is connected to the signal processing unit 22 for receiving data signals representing complex impedances that have been determined from output signals provided by the impedance measurement circuit 16. The electronic evaluation and control unit 30 is further configured for automatically controlling the electric distribution box 20, and for evaluating the complex impedances received from the signal processing unit 22 during a measurement cycle. Appropriate control/data lines 26 are provided.

The impedance measurement circuit 16 and the electronic evaluation and control unit 30 are installed in the vehicle, remote from the vehicle steering wheel 38. The electronic evaluation and control unit 30 is data-linked with an ADAS 44 of the vehicle.

In the following, an embodiment of a method of operating the capacitive sensing device 10 pursuant to FIG. 1 will be described with reference to FIG. 1 and FIG. 2, in which an overview block diagram of a method is provided. In preparation of operating the capacitive sensing device 10, it shall be understood that all involved units and devices are in an operational state and configured as illustrated in FIG. 1.

In order to be able to automatically and periodically carry out the method, the electronic control unit 30 comprises a software module 28 (FIG. 1). The method steps to be conducted are converted into a program code of the software module 28. The program code is implemented in the digital data memory unit 34 of the electronic control unit 30 and is executable by the processor unit 32 of the electronic control unit 30. Alternatively, the software module 28 may as well reside in and may be executable by another control unit of the vehicle, and established data communication means between the electronic evaluation and control unit 30 and the vehicle control unit would be used for enabling mutual data transfer.

The method, and thus also the software module, of operating the capacitive sensing device 10 comprises four main blocks 100, 200, 300, 400. The first block 100 comprises steps regarding measurement and sensor data processing. The second block 200 comprises steps regarding data analysis and evaluation and assigning data to a hand position or movement of the driver and to external effects, respectively, such as electromagnetic interference. Sensor data assigned to environmental condition changes are used for deriving and tracking a momentary reference value for the unknown complex impedance in the third method block 300. In the fourth method block 400 a hand position signal classification is performed based on the remaining determined sensor data relative to the reference value for the unknown complex impedance.

The following steps are to be executed for each of the predefined signal frequencies. The electronic control unit 30 is configured to control an automatic repetition of the steps in a periodic manner.

Figure 2:
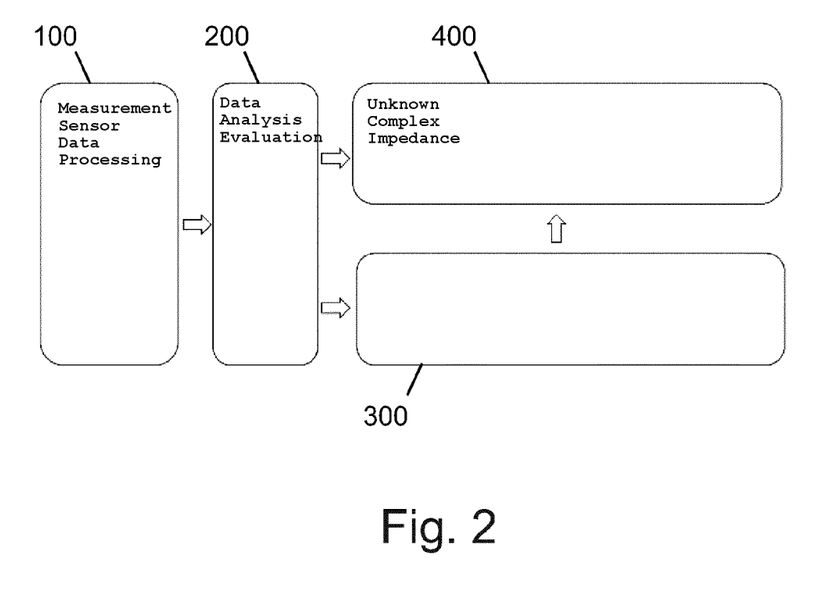
FIG. 2 illustrates an overview block diagram of a method in accordance with the invention of operating the capacitive sensing device pursuant to FIG. 1.
Figure 3:
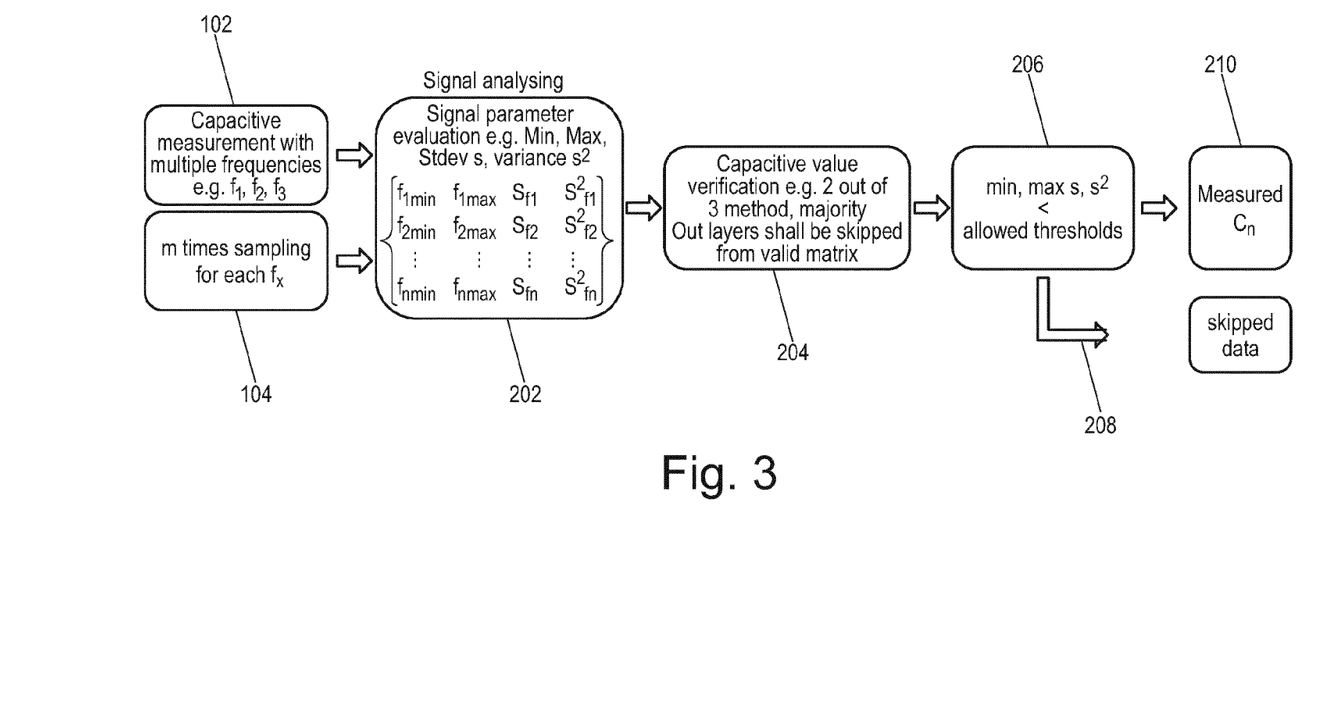
FIG. 3 shows a diagram of a block detail of the method pursuant to FIG. 2.

FIG. 3 shows a diagram of a block detail of the method pursuant to FIG. 2, comprising sensor data analysis and evaluation.

In a step 102 of the method, a predefined number m of momentary values of the unknown complex impedance is determined. To this end, for each of the signal frequencies $f_1$ to $f_3$ multiple sampling is applied by an analog-to-digital converter (ADC) in a step 104. The step 104 includes sampling with a sampling period that may lie between 0.1 ms and 100 ms so as to capture fast effects that may affect the measurement of the unknown complex impedance.

In another step 202 statistical quantities and signal parameters regarding the determined momentary values are determined. Examples of statistical quantities and signal parameters may be minimum value, maximum value, standard deviation and variance of a magnitude of the determined complex momentary values.

In a signal filtering step 204 small-band EMC disturbances may be identified in the number m of momentary values of the unknown complex impedance for any of the three signal frequencies $f_1$ to $f_3$. If complex impedance values of one signal frequency appear to be disturbed, meaning that they are statistical outliers, which is manifested by a determined statistical quantity exceeding a predefined critical threshold value, the respective determined momentary values are excluded in a step 206.

In a second class of filtering, electromagnetic noise on the ADC sampling values is evaluated. In some noise environment the determined momentary values can be disturbed by broadband noise. As affected momentary values should not influence a classification process, such values need to be excluded from classification as well. In an according step 208, a frequency portion from a predefined high-frequency limit down to a predefined hand touch movement upper limit frequency is eliminated from the determined momentary values for obtaining remaining determined momentary values. Magnitudes of the obtained remaining determined momentary values are averaged in another step 210 and provided for further signal processing.

Figure 4:
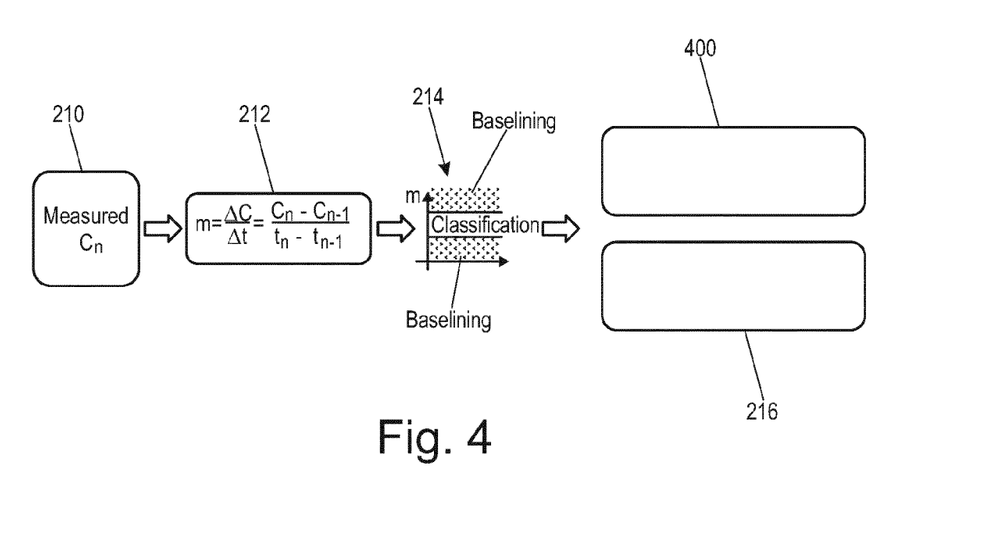
FIG. 4 shows a diagram of another block detail of the method pursuant to FIG. 2.

FIG. 4 shows a diagram of another block detail of the method pursuant to FIG. 2, comprising assigning of determined momentary values to a hand position or movement of the driver and to changes of environmental conditions, respectively.

From the averaged magnitudes of the obtained remaining determined momentary values, a time derivative of magnitudes of consecutively determined momentary values of the unknown complex impedance is calculated in a step 212 of the method, wherein the time derivative is approximated by a difference quotient.

A step 214 of eliminating from the determined momentary values a frequency portion up to a predefined hand touch movement lower limit frequency is based on using the calculated time derivative. Thus, all determined momentary values that are outside of a range of a typical hand movement are not used for classification in a direct way.

However, the eliminated frequency portion up to the lower limit frequency of the determined momentary values are used for calculating a momentary reference value for the unknown complex impedance in another step 216. In the present embodiment of the capacitive sensing device 10 the momentary reference value for the unknown complex impedance represents the momentary capacitance of a virtual configuration of the vehicle steering wheel 38 being untouched by the drivers hands.

Figure 5:
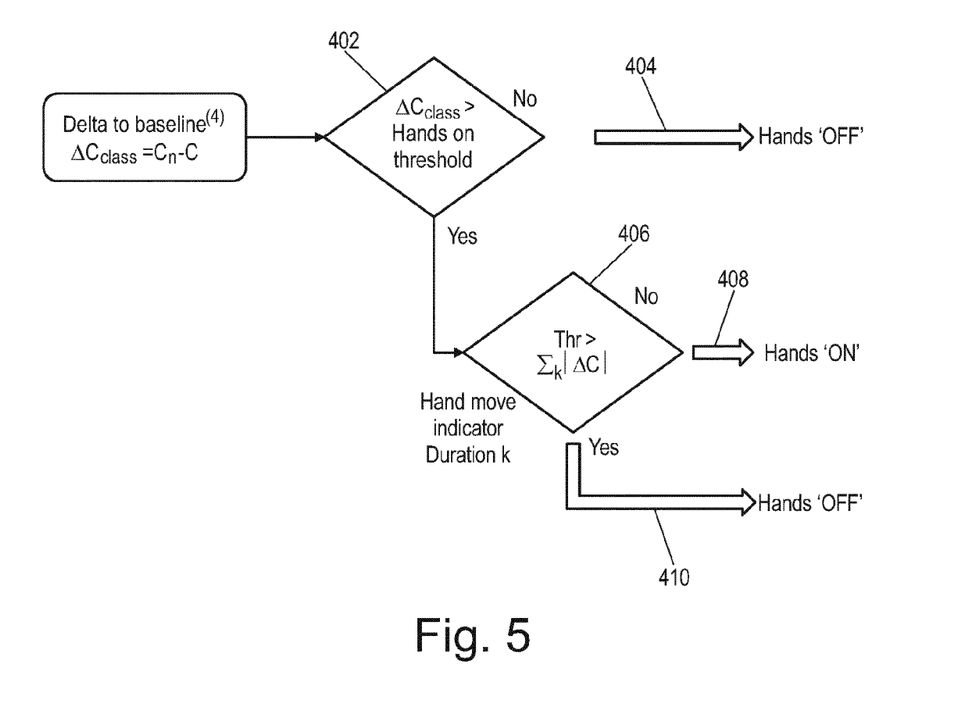
FIG. 5 shows a diagram of another block detail of the method pursuant to FIG. 2.

FIG. 5 shows a diagram of another block detail of the method pursuant to FIG. 2, comprising steps of classification.

In these steps of classification, the remaining determined momentary values are used for determining a signal classification by checking a fulfillment of several predefined conditions that include the momentary reference value for the unknown complex impedance.

In a first step 402 of classification it is checked if an absolute difference between the magnitude of the remaining determined momentary values and the magnitude of the momentary reference value for the unknown complex impedance exceeds a predefined threshold value for the magnitude. If the absolute difference exceeds the predefined threshold value it is verified that the vehicle steering wheel 38 is not untouched or empty. If the absolute difference falls below the predefined threshold value, a classification that would represent a Hands-Off configuration is determined in a step 404.

In another step 406 of classification it is checked if in a predefined period of time a sum of magnitudes of consecutively occurring signal changes of the remaining determined momentary values exceeds a predefined threshold value for the sum of magnitudes of signal changes. The sum of magnitudes of consecutively occurring signal changes of the remaining determined momentary values in a predefined period of time could be considered a 'hand movement indicator' value and may be referred to as such in the following. If the driver's hand is moving in a typically human way along the vehicle steering wheel 38, the predefined threshold value for the hand movement indicator value would be exceeded, and a 'Hands On' classification determined in a step 408. If a value of the 'hand movement indicator' is lower than or equal to the predefined threshold value for the hand movement indicator value, a signal classification would be determined representing a 'Hands Off' configuration in a step 410.

In another step 412, the electronic evaluation and control unit generates an output signal that is representative of the result of the step of checking the fulfillment of several predefined conditions as a classification result (FIG. 1).

Figure 6:
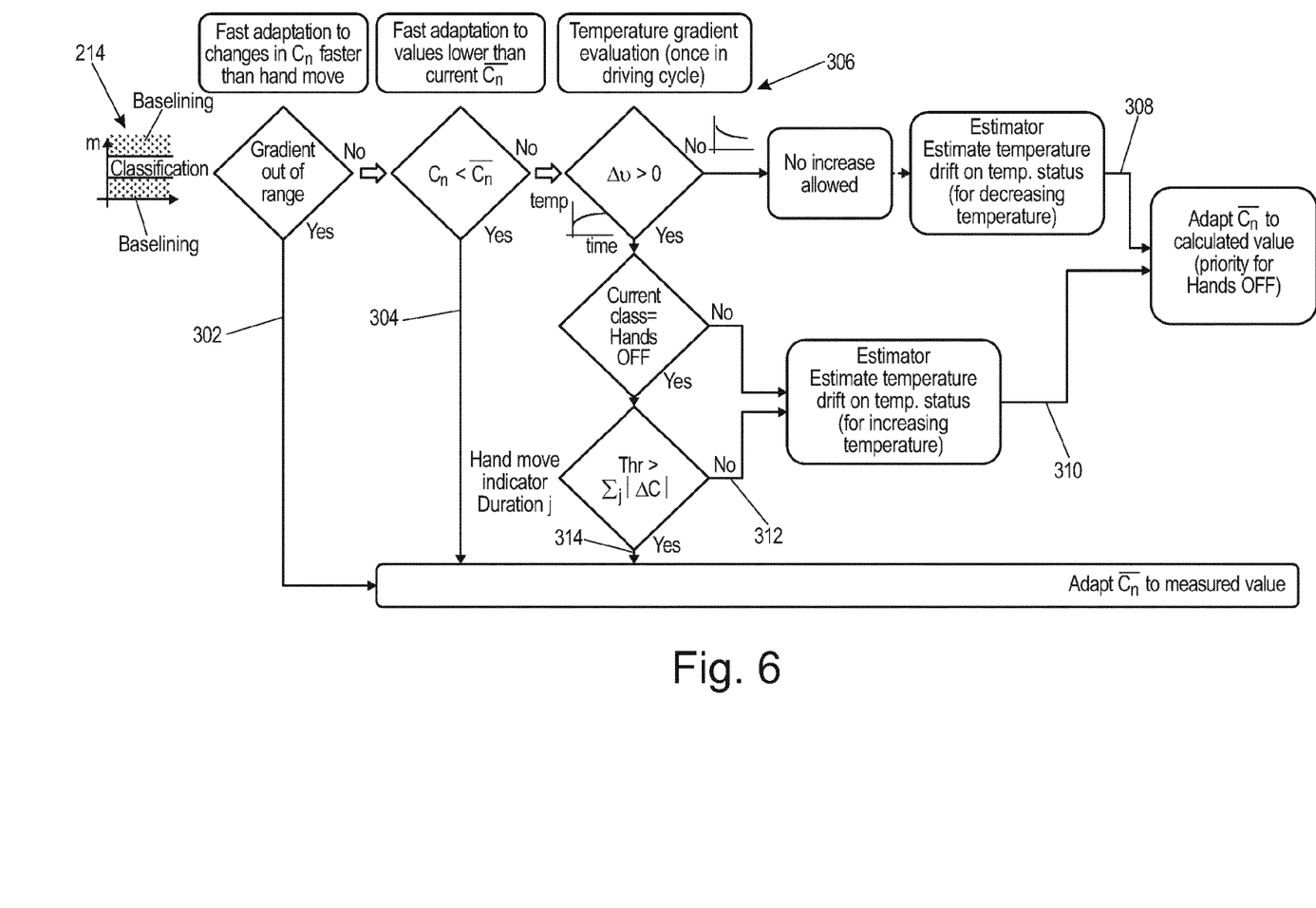
FIG. 6 shows a diagram of another block detail of the method pursuant to FIG. 2.

FIG. 6 shows a diagram of another block detail of the method pursuant to FIG. 2, comprising steps for keeping track of the momentary reference value for the unknown complex impedance. In particular, the eliminated frequency portion from the predefined high-frequency limit down to the predefined hand touch movement upper limit frequency and the eliminated frequency portion up to a predefined hand touch movement lower limit frequency of the determined momentary values are used in these steps.

In a step 302 of the method, the momentary reference value is immediately adapted upon a fulfillment of a condition concerning the time derivative of magnitudes of consecutively determined momentary values of the unknown complex impedance. An unintended event such as a sudden change of electrical ground connections within the capacitive sensing device 10 results in large values for the time derivative of magnitudes. If the condition is fulfilled that the time derivative of magnitudes of consecutively determined momentary values of the unknown complex impedance exceeds a predefined threshold value, the momentary reference value is immediately adapted, which will result in a hand position classification representing a 'Hands Off' configuration, as an absolute difference between the magnitude of the remaining determined momentary values and the magnitude of the momentary reference value for the unknown complex impedance from step 402 falls below the predefined threshold value for the magnitude.

It is worth noting that the momentary reference value is immediately adapted only when consecutively determined momentary values of the unknown complex impedance are available.

In another step 304 for keeping track of the momentary reference value for the unknown complex impedance the momentary reference value is immediately adapted upon a fulfillment of the condition that the magnitude of the momentary reference value is smaller than the magnitude of the latest precedingly calculated momentary reference value for the unknown complex impedance. A condition for this to happen may be that the vehicle steering wheel 38 is touched at startup of the system and then the driver is releasing the steering wheel 38.

Another step 306 for keeping track of the momentary reference value for the unknown complex impedance is to be executed once in a driving cycle of a vehicle, i.e. in the time period between vehicle startup and shutdown. The step 306 includes adapting the momentary reference value upon a fulfillment of the condition that an ambient temperature rise at the sense electrode 12 of the capacitive sensor exceeds a predefined threshold for the ambient temperature rise. The amount of adapting is determined from an a priori known temperature-dependence of a material in the vicinity of the sense electrode 12 of the capacitive sensor. The step of determining may be executed by a statistical estimator that may form part of the software module.

The temperature change has a direct impact on a stray capacitance of the vehicle steering wheel 38. As temperature is a slowly changing condition the change is mainly in one direction per driving cycle. Either the startup will be at a relatively lower temperature and the vehicle steering wheel 38 will heat up to a comfortable condition, or the startup will be at relatively higher temperature and the vehicle steering wheel 38 will cool down while an air condition device is cooling an interior of the vehicle. Due to this the temperature change will be evaluated once in a driving cycle, and the determined amount of adapting needs to be implemented for a next driving cycle only.

In case the temperature in the interior of the vehicle is going down during the drive cycle, the stray capacitance of the vehicle steering wheel 38 will decrease, and most likely the momentary reference value for the unknown complex impedance will already be adapted in step 304. If the determined momentary value for the unknown complex impedance is larger than the momentary reference value all the time, the statistical estimator may slowly lower the momentary reference value with respect to a calibration parameter in another step 308.

If in another driving cycle the temperature in the interior of the vehicle is going up, the stray capacitance is going up. The momentary reference value for the unknown complex impedance needs to be adapted to this change to avoid a 'faulty hand touch'. If the steering wheel 38 is touched and classified as 'hand on' all the time, the momentary reference value for the unknown complex impedance is hidden below the determined momentary values.

In this case a step 310 is carried out in which the statistical estimator recalculates the stray capacitance of the vehicle steering wheel 38 in relation to the temperature change. The output will be used to adapt the momentary reference value for the unknown complex impedance.

If the determined momentary values for the unknown complex impedance are classified as 'Hands Off', but the 'hand movement indicator' value exceeds the predefined threshold value for the sum of magnitudes of signal changes, the estimator is also used to recalculate the momentary reference value in a step 312. Only in case the sum of magnitudes of consecutively occurring signal changes detected by the 'hand movement indicator' is smaller than the respective threshold value, the momentary reference value will be adapted and replaced by the determined momentary value in a step 314.

In other embodiments of the method a similar sequence of steps may be implemented, in addition or replacement, for adapting the momentary reference value upon a fulfillment of the condition that an ambient humidity rise exceeds a predefined threshold for the ambient humidity rise, which will result in an increase of the stray capacitance of the vehicle steering wheel 38. The steps to be carried out correspond to those for a temperature increase of the vehicle interior.

Moreover, it is also conceived within the scope of the invention that the method is modified such that momentary values of the unknown complex impedance are determined with the measurement signal comprising three fixed predefined signal frequencies, and the steps of analyzing a carried out separately for each measurement signal frequency data set by evaluating the changes of the determined momentary values of the unknown complex impedance and the signal noise. Then, an additional step of comparison between the three measurement signal frequency data sets would be performed. If a parameter under consideration is similar for the three measurement signal frequency data sets, the momentary value of the unknown complex impedance can be considered valid. The comparison of the parameters can then be done in each of the steps of the embodiment of the method described above.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. A method of operating a capacitive sensing device that includes:
   at least one capacitive sensor having at least one sense electrode,
   a measurement signal source configured to provide an alternating electric measurement signal comprising at least three fixed predefined signal frequencies at least to the at least one sense electrode,
   an impedance measurement circuit configured to determine an unknown complex impedance of the at least one sense electrode from a response to the provided electric measurement signal, the method comprising at least the following steps:
- operating the measurement signal source to provide an alternating electric measurement signal comprising at least three fixed predefined signal frequencies to the at least one sense electrode,
- by the impedance measurement circuit, measuring a response to the alternating electric measurement signal to determine an unknown complex impedance of the at least one sense electrode, the method further comprising at least the following steps that are to be executed for each of the at least three fixed predefined signal frequencies:
- determining a predefined number of momentary values of the unknown complex impedance,
- determining statistical quantities and signal parameters regarding the determined momentary values,
- eliminating from the determined momentary values a frequency portion up to a predefined hand touch movement lower limit frequency,
- eliminating from the determined momentary values a frequency portion from a predefined high-frequency limit down to a predefined hand touch movement upper limit frequency for obtaining remaining determined momentary values,
- excluding the respective determined momentary values if at least one determined statistical quantity exceeds a predefined critical threshold value,
- using the eliminated frequency portion up to the lower limit frequency of the determined momentary values for calculating a momentary reference value for the unknown complex impedance, and further comprises the steps of
- using the remaining determined momentary values for determining a signal classification by checking a fulfillment of at least one predefined condition that includes the momentary reference value for the unknown complex impedance, and
- generating an output signal that is representative of the result of the step of checking the fulfillment of the at least one predefined condition.

2. The method as claimed in claim 1, wherein the step of eliminating from the determined momentary values the frequency portion from a predefined high-frequency limit down to the predefined hand touch movement upper limit frequency further includes a subsequent step of averaging the magnitudes of the obtained remaining determined momentary values.

3. The method as claimed in claim 1, wherein the steps of eliminating from the determined momentary values a frequency portion each include a preceding step of calculating a time derivative of magnitudes of consecutively determined momentary values of the unknown complex impedance, and wherein the steps of eliminating are based at least on using the calculated time derivative.

4. The method as claimed in claim 1, wherein the step of checking a fulfillment of at least one predefined condition includes checking if an absolute difference between the magnitude of the remaining determined momentary values and the magnitude of the momentary reference value for the unknown complex impedance exceeds a predefined threshold value for the magnitude.

5. The method as claimed in claim 1, wherein the step of checking a fulfillment of at least one predefined condition includes checking if in a predefined period of time a sum of magnitudes of consecutively occurring signal changes of the remaining determined momentary values exceeds a predefined threshold value for the sum of magnitudes of signal changes.

6. The method as claimed in claim 1, wherein the step of determining a predefined number of momentary values of the unknown complex impedance includes sampling with a sampling period that lies between 0.1 ms and 100 ms.

7. The method as claimed in claim 1, further comprising a step of immediately adapting the momentary reference value upon a fulfillment of at least one condition including a time derivative of magnitudes of consecutively determined momentary values of the unknown complex impedance.

8. The method as claimed in claim 1, further comprising a step) of immediately adapting the momentary reference value upon a fulfillment of the condition that the magnitude of the momentary reference value is smaller than the magnitude of the latest precedingly calculated reference value for the unknown complex impedance.

9. The method as claimed in claim 1, further comprising a step to be executed once in a driving cycle of a vehicle of adapting the momentary reference value upon a fulfillment of the condition that an ambient temperature rise or an ambient humidity rise at the at least one capacitive sensor exceeds a predefined threshold for the ambient temperature rise or the ambient humidity rise, respectively, wherein the amount of adapting is determined from an a priori known temperature-dependence or humidity-dependence, respectively, of a material in the vicinity of the at least one sense electrode of the at least one capacitive sensor.

10. A capacitive sensing device including:
- at least one capacitive sensor having at least one sense electrode,
- a measurement signal source that is configured for providing an alternating electric measurement signal comprising at least three fixed predefined signal frequencies at least to the at least one sense electrode,
- an impedance measurement circuit that is configured for determining an unknown complex impedance of the at least one sense electrode with regard to a reference potential from a response to the provided electric measurement signal, and
- an electronic evaluation and control unit that is configured to automatically execute steps of the method as claimed in claim 1.

11. A vehicle steering wheel with capacitive hands off detection, comprising a capacitive sensing device as claimed in claim 10.

12. Use of a capacitive sensing device as claimed in claim 10 in a vehicle steering wheel for at least one of capacitive hands off detection and capacitive hand position detection.

13. A software module for controlling an automatic execution of the method as claimed in claim 1, wherein the method steps comprise a program code of the software module, wherein the program code is implementable in a digital data memory unit of a control unit and is executable by a processor unit of the control unit.

* * * * *